United States Patent [19]
Tarrant

[11] Patent Number: 5,111,462
[45] Date of Patent: May 5, 1992

[54] DECODERS FOR HAMMING ENCODED DATA

[75] Inventor: David R. Tarrant, Sutton, England

[73] Assignee: U.S. Philips Corporation, New York, N.Y.

[21] Appl. No.: 356,041

[22] Filed: May 23, 1989

[30] Foreign Application Priority Data

May 27, 1988 [GB] United Kingdom ............ 8812592
May 5, 1989 [GB] United Kingdom ............ 8910339

[51] Int. Cl.$^5$ ............................................. G06F 11/10
[52] U.S. Cl. ................................. 371/37.1; 371/37.6
[58] Field of Search ........................... 371/37.6, 37.1

[56] References Cited

U.S. PATENT DOCUMENTS

| | | | |
|---|---|---|---|
| 3,601,800 | 8/1971 | Lee | 371/37.6 |
| 4,105,999 | 8/1978 | Nakamura | 371/37.6 |
| 4,312,068 | 1/1982 | Goss et al. | 371/37.6 |
| 4,450,561 | 5/1984 | Gotze et al. | 371/37.6 |
| 4,454,600 | 6/1984 | Le Gresley | 371/37.6 |
| 4,494,234 | 1/1985 | Patel | 371/37.6 |
| 4,791,641 | 12/1988 | Hillis | 371/37.6 |

OTHER PUBLICATIONS

"World System Teletext and Data Broadcasting", Technical Specification, Dec. 1987, Published by The Department of Trade & Industry, London.

Primary Examiner—Charles E. Atkinson
Attorney, Agent, or Firm—William Squire

[57] ABSTRACT

A decoder for Hamming encoded data in the form of a serial bit stream successive blocks of which are Hamming encoded comprises a serial-to-parallel converter for converting each of the blocks into a plurality of successive parallel bytes, a plurality of parity check circuits for carrying out successive partial parity checks on each of the bytes of a block as each byte is received, and a further plurality of parity check circuits for carrying out parity checks on at least part of successive ones of the bytes as they are received, a parity checker decoder being provided to which the outputs of the parity check circuits are applied for affording an output indicative of possible errors in the block.

11 Claims, 2 Drawing Sheets

DECODERS FOR HAMMING ENCODED DATA

BACKGROUND OF THE INVENTION

1. Field of the Invention

This invention relates to decoders for Hamming encoded data in the form of a serial bit stream, successive blocks of which are Hamming encoded. The invention also relates to a method of decoding Hamming encoded data. The invention is particularly applicable to such decoders for use in the reception of teletext information.

2. Description of the Prior Art

The document "World System Teletext and Data Broadcasting System-Technical Specification", December 1987, compiled by the Department of Trade and Industry of the U.K. Government, discloses a system for transmitting teletext information in 625-line and 525-line television systems.

This specification, amongst other things, specifies the use of so-called EXTENSION packets and some of these packets, but particularly so-called "packet 26" "packet 28", "packet 29" and some versions of "packet 27" has coded data encoded using the 24/18 Hamming coding scheme where each 18 data bits are protected by 6 protection bits. This form of Hamming coding allows a single bit error to be detected and corrected and 2 bit errors to be detected within the group of 24 bits. Such extension packets are used to help control the teletext decoder or to supply additional information so that superior decoders can enhance the appearance of the basic display page. The enhancements may take the form of accented characters, improved graphics, etc. It is therefore necessary in a teletext decoder of a teletext receiver to provide a means of decoding the 24/18 Hamming protected data.

Up to the present time, the decoding of some of the Hamming protected data has been carried out in the teletext decoder by a microprocessor using software techniques, but this places great demands on the microprocessor and compromises the performance of the decoder. It would be advantageous if the decoding could be carried out using suitable hardware which could be incorporated on the teletext decoder integrated circuit, and thereby reduce the demand on the microprocessor.

SUMMARY OF THE INVENTION

It is an object of the present invention to provide a decoder for Hamming encoded data which can be implemented in hardware form.

According to one aspect of the present invention there is provided a decoder for Hamming encoded data in the form of a serial bit stream successive blocks of which are Hamming encoded, wherein the decoder comprises serial to parallel converter means for converting each of the blocks into a plurality of successive parallel bytes, a plurality of first parity check circuits for carrying out successive partial parity checks on each of the bytes of a block as each byte is received, and a plurality of second parity check circuits for carrying out parity checks on at least part of selected ones of the bytes as they are received, the outputs of the parity check circuits being combined to afford an output indicative of possible errors in said block.

In carrying out the invention, the partial parity checks carried out on successive bytes of a block may take account of the partial parity check carried out on the previous byte.

In a preferred arrangement in which the serial data stream consists of blocks of 24 bits each block including 18 data bits and 6 Hamming encoded protection bits, the serial to parallel converter means converts each block into 3 successive bytes, 4 first parity check circuits being provided for carrying out successive parity checks on each of the bytes, and two second parity check circuits being provided for carrying out parity checks on at least part of the second and third bytes respectively of the block.

Advantageously, byte delay means for delaying each block of bytes until the parity checks have been carried out and parity check decoder means to which the outputs of the parity check circuits are applied which is operable on the delay block of bytes for affording an error corrected output may be provided.

Also, each of the first parity check circuits may comprise a parity checker the output of which is applied to a latch, the output of the latch being fed back as an input to the parity checker via an AND gate in dependence upon which byte of each block is being checked.

According to another aspect of the present invention there is provided a teletext decoder including a decoder according to the one aspect.

According to a further aspect of the present invention there is provided a method of decoding Hamming encoded data in the form of a serial bit stream successive blocks of which are Hamming encoded, characterised by the steps of serial to parallel converting each of the blocks into a plurality of successive parallel bytes, carrying out a plurality of successive partial parity checks on each of the bytes of a block as each byte is received, and carrying out a plurality of parity checks on at least part of selected ones of the bytes as they are received, and combining the outputs of the parity checks to afford an output indicative of possible errors in the block.

IN THE DRAWING

An exemplary embodiment of the invention will now be described reference being made to the accompanying drawings, in which:

FIG. 1 is a table which is useful in explaining the operation of a decoder for 24/18 Hamming encoded data; and FIG. 2 is a block diagram of a decoder for Hamming coded data in accordance with the present invention.

DESCRIPTION OF THE PREFERRED EMBODIMENT

Figure 2:
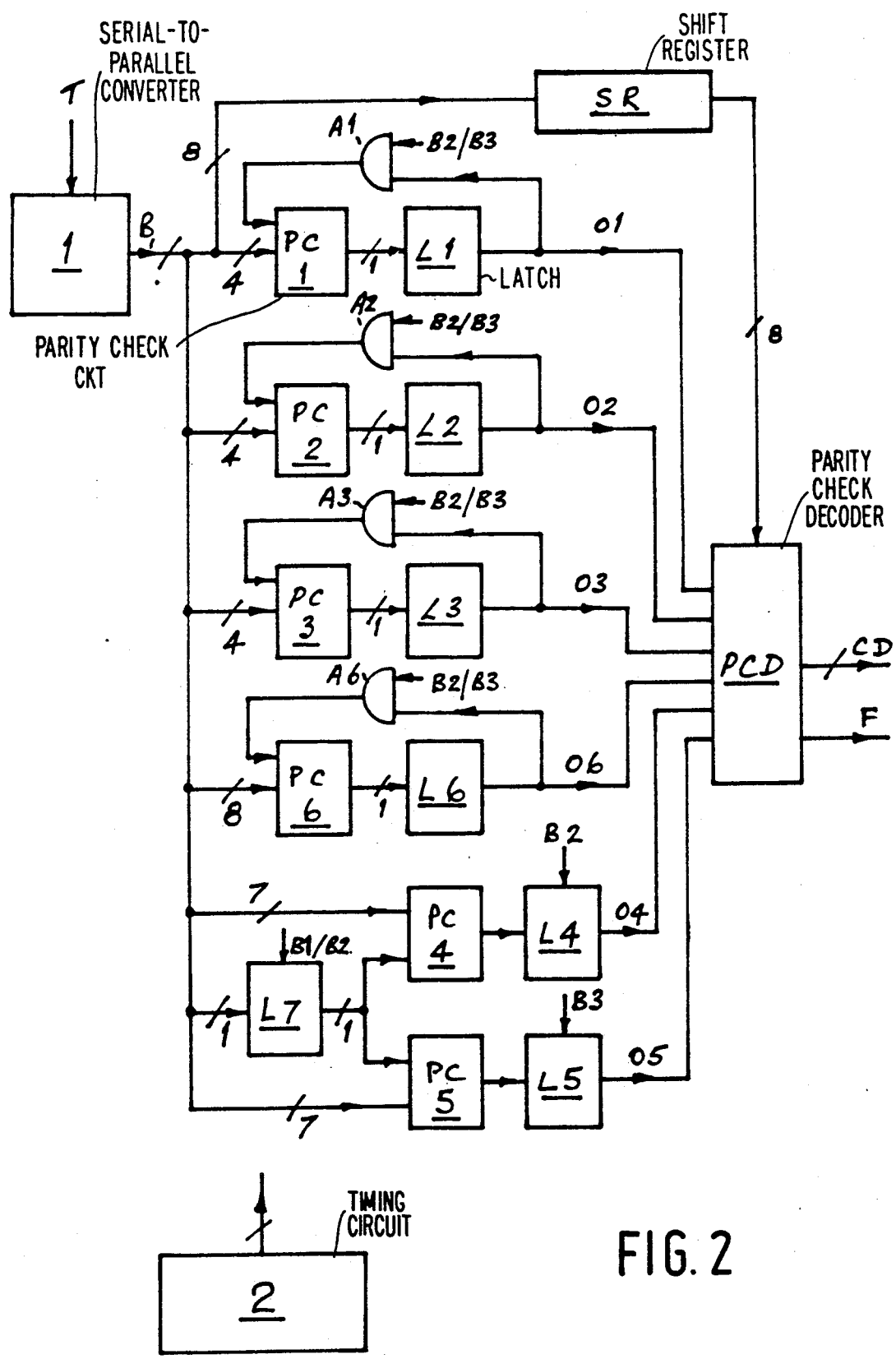

The aforementioned "World System Teletext and Data Broadcasting System—Technical Specification" sets out in APPENDIX 3 thereof under the title "HAMMING PROTECTED DATA" and in its accompanying FIG. 2 the precise form that the aforementioned 24/18 Hamming encoded data takes and also specifies what parity checks a decoder needs to make in order to detect errors therein.

Figure 1:
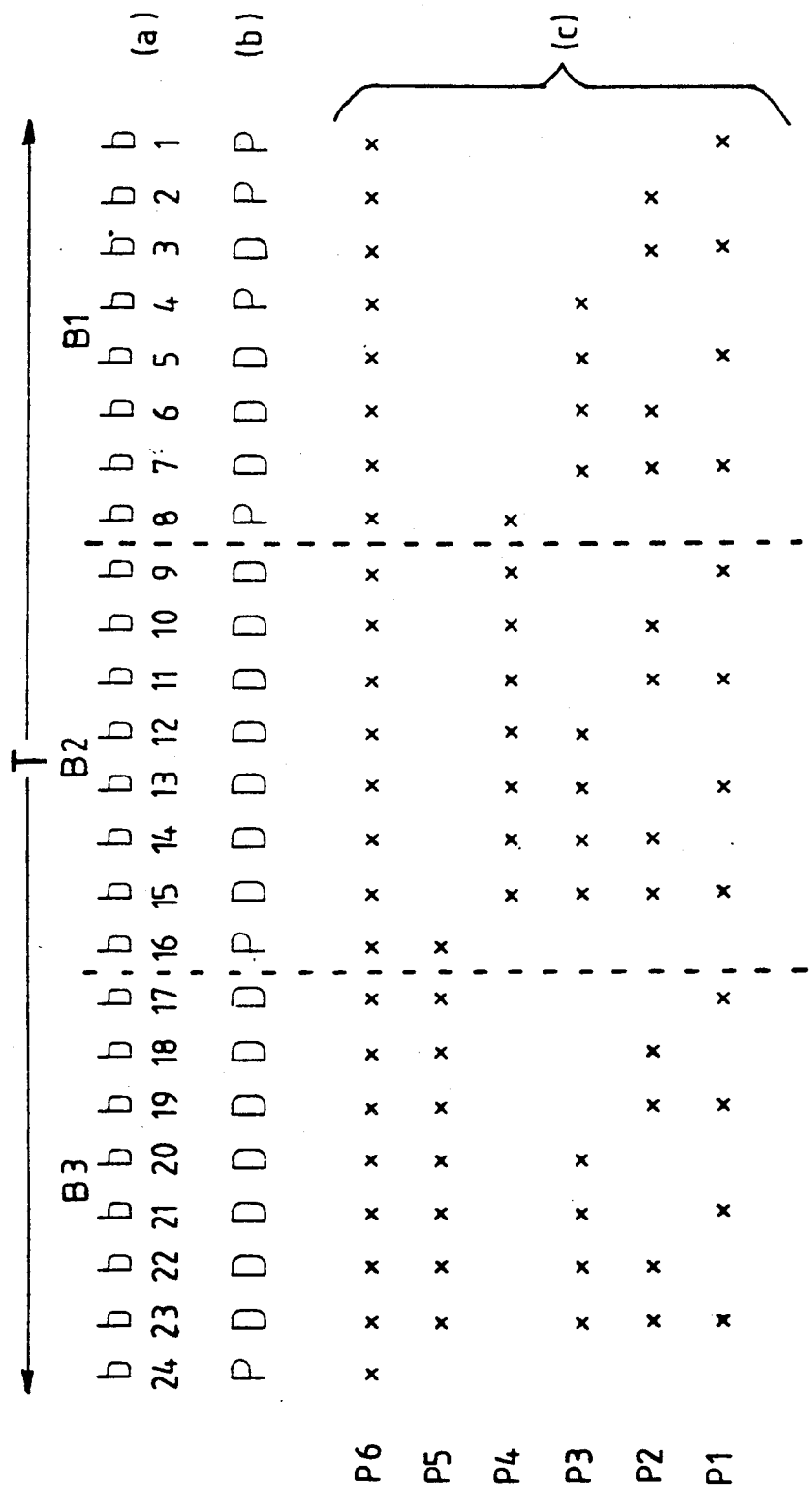

In FIG. 1 of the accompanying drawings herewith there is shown a table which is useful in explaining the operation of such a decoder.

In row (a) of FIG. 1 there is set out a group of three bytes B1, B2 and B3 which in combination form a triplet T comprising 24 bits which, for convenience, are numbered b1 to b24. In row (b) of FIG. 1 is depicted whether the bits b1 to b24 are information or data bits D or protection bits P. It will be seen that bits b1, b2, b4, b8 and b16 are binary weighted protection bits P and bit b24 is a parity check over the whole three bytes, the remaining eighteen bits being information bits D. In rows (c) of FIG. 1 are set out the various parity checks P1 to P6 which need to be carried out by a decoder in order to determine whether the triplet T is error free or not. The symbol x is used to indicate the combination of bits of the triplet which need to be checked for parity for each of the parity checks P1 to P6.

In prior known teletext decoders the decoding of the triplet T shown in row (a) of FIG. 1 in accordance with the parity checks P1 to P6 has been carried out by the microprocessor thereof and it would be preferable if the decoding could be carried out using hardware which could be provided on the teletext decoder integrated circuit, thereby leaving the microprocessor free for other processing tasks.

It has been appreciated and as can be seen in rows (c) of the table of FIG. 1 that as far as the parity checks P1, P2, P3 and P6 are concerned, the parts of the parity checks which relate to each of the bytes B1, B2 and B3 of the triplet T are the same for each byte. For example, in parity check P1 the odd numbered bits of each of the bytes B1, B2 and B3 are checked; in parity check P2 the second, third, sixth and seventh bits of each of the bytes B1, B2 and B3 are checked; in parity check P3 the fourth, fifth, sixth and seventh bits of each of the bytes B1, B2 and B3 are checked; and in parity check P6 all of the bits of each byte are checked. Also, parity checks P4 and P5 are similar in that the first seven bits of one byte are included with the last bit of the previous byte for parity checking.

Because of this similarity in the parity checks required within each of the bytes B1, B2 and B3, it has been appreciated that it is not necessary to await the receipt of all the bits b1 to b24 of the triplet T before decoding can be commenced but that partial parity checks can be initiated as soon as the first byte B1 of the triplet T has been received, the partial parity checks being repeated, where appropriate, for the remaining bytes together with the other necessary parity checks. A decoder for Hamming encoded data which operates in accordance with this procedure is shown in FIG. 2 of the drawings.

In FIG. 2, the twenty-four bits of the triplet T in serial form are applied to a serial-to-parallel converter arrangement 1 which converts it into three successive 8-bit bytes afforded over parallel output bus B. The outputs from bus B are selectively applied to six parity check circuits PC1 to PC6 which correspond respectively to parity checks P1 to P6 set out in row (c) of FIG. 1 of the drawings.

Considering firstly parity check circuit PC1, this has the outputs from the bus B corresponding to the odd numbered bits of each byte applied to it and carries out, for example, an odd parity check on the inputs applied to it and affords an output which is stored in latch L1. The output from the latch L1 is fed to a parity check decoder PCD the operation of which will be described hereinafter and also to an AND gate A1. The other input of the AND gate A1 is set high if either byte B2 or B3 is being processed by the parity check circuit PC1, in which case the output from the latch L1 is fed back as an input to the parity check circuit PC1 and is included in the parity check which is carried out by it. The parity check circuit thus far described operates as follows:

As soon as the first byte B1 of the triplet appears on the bus B the parity check circuit PC1 carries out a partial parity check on the inputs applied to it and affords an output to the latch L1. At this time, as only the byte B1 is being processed the second input to the AND gate A1 will be set low, and the output from the latch L1 is not fed back to the parity check circuit PC1.

When the second byte B2 of a triplet appears on the bus B, the second input to the AND gate A1 is set high and the output from the latch L1, which corresponds to the partial parity check carried out on byte B1 of the triplet is fed back as an input to the parity check circuit PC1. The parity check circuit PC1 carries out a further partial parity check on the inputs applied to it and affords an output to the latch L1.

When the third byte B3 of a triplet appears on the bus B, the second input to the AND gate A1 will be maintained high and the output from the latch L1, which corresponds to the partial parity check carried out on bytes B1 and B2 of the triplet, is fed back as an input to the parity check circuit PC1. The parity check circuit carries out a further partial parity check on the inputs applied to it and affords an output to the latch L1. The final output which is afforded to the latch L1 corresponds to the parity check P1 set out diagrammatically in rows (c) of FIG. 1 of the drawings.

The parity check circuits PC2, PC3 and PC6, with their respective latch and AND gate, operate in the same way as parity check circuit PC1, except that different combinations of the outputs from the bus B are applied to them. For example:

Parity check circuit PC2 will have the second, third, fifth and sixth bits of each byte applied to it and will afford a final output to its latch L2 which corresponds to the parity check P2 set out diagrammatically in rows (c) of FIG. 1 of the drawings;

Parity check circuit PC3 will have the fourth, fifth, sixth and seventh bits of each byte applied to it and will afford a final output to its latch L3 which corresponds to the parity check P3 set out diagrammatically in rows (c) of FIG. 1 of the drawings; and Parity check circuit PC6 will have all of the bits from each byte applied to it and will afford a final output to its latch L6 which corresponds to the parity check P6 set out diagrammatically in rows (c) of FIG. 1 of the drawings.

The parity check circuit PC4 carries out a parity check on the first seven bits of byte B2 and the last bit from the previous byte as held in latch L7, and affords an output to latch L4 which is retained for the byte B2 until it is updated.

The parity check circuit PC5 carries out a similar parity check on the corresponding bits in bytes B3 and B2 and affords an output to its latch L5 which is retained for the byte B3 until it is updated.

The outputs held in latches L4 and L5 correspond to the parity checks P4 and P5 respectively, which are set out diagrammatically in rows (c) of FIG. 1.

The outputs O1 to O6 from the latches L1 to L6 respectively are applied as inputs to the parity check decoder PCD. The output bus B is also applied to a delay arrangement conveniently in the form of a shift register SR so that the bytes B1, B2 and B3 of the triplet which has been processed by the parity check procedure just described are available at the decoder D so that any necessary corrections, as determined by the outputs O1 to O6 as will hereinafter be explained, can be made. In FIG. 2 a timing circuit 2 is provided for controlling the timing of the various partial and full parity checks, etc. in known manner.

The parity checks carried out by each of the odd parity check circuits PC1 to PC6 afford a logic '0' if the parity check is positive i.e. correct and a logic '1' if the parity check is negative i.e. parity error has been detected. Thus the outputs O1 to O6 of the parity check circuits PC1 to PC6 respectively will be a logic '0' or a logic '1' dependent upon whether the respective parity check is positive or negative.

Consider now the parity checks P1 to P5 set out in the rows (c) of FIG. 1. Assume, for example, that an error exists in bit b13, then it can be seen that bit 13 is included in each of the parity checks P1, P3 and P4, and the outputs O1, O3 and O4 corresponding to these parity checks will each be a logic '1'. The outputs O2 and O5 will be a logic '0'.

If the outputs O1 to O5 are considered in the following order:

O5 O4 O3 O2 O1 then the combination of these outputs can be used to determine which single bit of the 24 bits of a triplet, if any, is in error, and would enable that bit to be corrected. In the example being considered the binary number 0 1 1 0 1 will be obtained. It will be appreciated that this binary number is equivalent to the number 13 which corresponds to the bit number that is in error.

However, it may happen that two bits of the 24 bit triplet are in error and to ascertain this the output O6 which corresponds to the parity check P6 in row (c) of FIG. 1 has to be considered in conjunction with the outputs O1 to O5. It can be shown that the following conditions apply:

If O6 is logic '0' & O1 to O5 are all logic '0'—no errors

If O6 is logic '1' & O1 to O5 are all logic '0'—error in b24 only

If O6 is logic '1' & O1 to O5 are not all logic '0'—single bit error

If O6 is logic '0' & O1 to O5 are not all logic '0'—double error

Since single errors are correctable, only if a double error exists is the triplet not usable.

From the foregoing it will be appreciated that the parity check decoder PCD in FIG. 2 can ascertain from the outputs O1 to O6 applied to it the error status of a triplet that has been processed and can afford a corrected data output CD corresponding to the information bits D in the original 24 bit triplet and can afford an output which is indicative of whether the data output CD is usable data or not.

Turning now to the use of the decoder described with reference to FIG. 2 in the teletext decoder, the provision of the various parity check circuits PC1 to PC6 and their associated circuitry for effecting the necessary parity checks that need to be carried out on the Hamming encoded data, enables most if not all of the encoder to be incorporated on the teletext decoder integrated circuit and thereby eases the demand on the microprocessor. A further advantage is obtained in that decoding of each triplet is commenced as soon as the first byte of the triplet has been received and it is not necessary to await the full receipt of the triplet.

Although it is envisaged that the immediate application of the decoder which has been described is in a teletext decoder, it should be appreciated that general use of the decoder is envisaged.

From reading the present disclosure, other modifications will be apparent to persons skilled in the art. Such modifications may involve other features which are already known per se and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

What is claimed is:

1. A decoder for Hamming encoded data in the form of a serial bit stream successive blocks of which are Hamming encoded, said decoder comprising: serial-to-parallel converter means for converting each of said blocks into a plurality of successive parallel bytes, a plurality of first parity check circuits for carrying out successive partial parity checks on each of the bytes of a block as each byte is received, and a plurality of second parity check circuits for carrying out parity checks on at least part of selected ones of said bytes as they are received, and means for combining the outputs of said parity check circuits to afford an output indicative of possible errors in a block.

2. A decoder as claimed in claim 1 wherein said plurality of first and second check circuits for carrying out partial parity checks on successive bytes of a block include means responsive to the partial parity check carried out on a previous byte.

3. A decoder as claimed in claim 1, in which the serial data stream comprises blocks of 24 bits, each block including 18 data bits and 6 Hamming encoded protection bits, wherein the serial-to-parallel converter means includes means for converting each block into three successive bytes, four first parity check circuits being provided for carrying out successive parity checks on each of said bytes, and two second parity check circuits being provided for carrying out parity checks on at least part of the second and third bytes respectively of a block.

4. A decoder as claimed in any preceding claim 1 further including byte delay means for delaying each block of bytes until said parity checks have been carried out and parity check decoder means to which the outputs of said parity check circuits are applied which is operable on the delayed block of bytes for affording an error corrected output.

5. A decoder as claimed in claim 4 wherein each of said first parity check circuits comprises a parity checker the output of which is applied to a latch, the output of said latch being fed back as an input to said parity checker via an AND gate in dependence upon which byte of each block is being checked.

6. A teletext decoder including a decoder for Hamming encoded data as claimed in claim 1.

7. A decoder as claimed in claim 1, wherein each of said first parity check circuits comprises a parity checker the output of which is applied to a latch, the output of said latch being fed back as an input to said parity checker via an AND gate in dependence upon which byte of each block is being checked.

8. A decoder as claimed in claim 2, in which the serial data stream comprises blocks of 24 bits, each block including 18 data bits and 6 Hamming encoded protection bits, wherein the serial-to-parallel converter means includes means for converting each block into three successive bytes, four first parity check circuits being provided for carrying out successive parity checks on each of said bytes, and two second parity check circuits being provided for carrying out parity checks on at least part of the second and third bytes respectively of a block.

9. A decoder as claimed in claim 2, wherein each of said first parity check circuits comprises a parity checker the output of which is applied to a latch, the output of said latch being fed back as an input to said parity checker via an AND gate in dependence upon which byte of each block is being checked.

10. A decoder as claimed in claim 3, wherein each of said first parity check circuits comprises a parity checker the output of which is applied to a latch, the output of said latch being fed back as an input to said parity checker via an AND gate in dependence upon which byte of each block is being checked.

11. A method of decoding Hamming encoded data in the form of a serial bit stream successive blocks of which are Hamming encoded, comprising the steps of serial-to-parallel converting each of said blocks into a plurality of successive parallel bytes, carrying out a plurality of successive partial parity checks on each of the bytes of a block as each byte is received, and carrying out a plurality of parity checks on at least part of selected ones of said bytes as they are received, and combining the outputs of said parity checks to afford an output indicative of possible errors in said block.

* * * * *